United States Patent
Tanabe

(10) Patent No.: US 9,532,445 B2
(45) Date of Patent: Dec. 27, 2016

(54) SUSPENSION BOARD WITH CIRCUIT AND PRODUCING METHOD THEREOF

(71) Applicant: NITTO DENKO CORPORATION, Osaka (JP)

(72) Inventor: Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/519,636

(22) Filed: Oct. 21, 2014

(65) Prior Publication Data

US 2015/0189742 A1 Jul. 2, 2015

(30) Foreign Application Priority Data

Dec. 26, 2013 (JP) ................ 2013-269912

(51) Int. Cl.
| | |
|---|---|
| H05K 1/00 | (2006.01) |
| H05K 1/03 | (2006.01) |
| G11B 5/48 | (2006.01) |
| G11B 21/16 | (2006.01) |
| H05K 1/02 | (2006.01) |
| H05K 1/05 | (2006.01) |
| H05K 3/44 | (2006.01) |

(52) U.S. Cl.
CPC ............ H05K 1/0245 (2013.01); G11B 5/484 (2013.01); *H05K 1/056* (2013.01); *H05K 3/44* (2013.01); *H05K 2201/09245* (2013.01); *H05K 2201/09254* (2013.01)

(58) Field of Classification Search
CPC ............... H05K 1/0296; H05K 2201/09554; H05K 2201/09827; H05K 2201/09845;H05K 2201/09481; H05K 2201/0367; H05K 2201/0376; H05K 2201/09045; H05K 2201/0939; H05K 2201/09445; H05K 2201/09745; H05K 2201/09818; H05K 2201/09863; G11B 5/484; G11B 5/486
USPC ........................................... 360/245.9, 245.8
See application file for complete search history.

(56) References Cited

U.S. PATENT DOCUMENTS

| | | | | |
|---|---|---|---|---|
| 6,388,201 B2* | 5/2002 | Yamato | ................. | G11B 5/486 174/250 |
| 7,388,733 B2* | 6/2008 | Swanson | ................ | G11B 5/484 360/245.9 |
| 8,320,083 B1* | 11/2012 | Dunn | ................... | G11B 5/4846 360/245.9 |
| 2005/0282088 A1* | 12/2005 | Aonuma | .................. | H05K 3/44 430/311 |
| 2011/0048783 A1* | 3/2011 | Yu | ........................ | H05K 3/0035 174/261 |

(Continued)

FOREIGN PATENT DOCUMENTS

JP 2012-114217 A 6/2012

*Primary Examiner* — Chau N Nguyen
*Assistant Examiner* — Roshn Varghese
(74) *Attorney, Agent, or Firm* — Jean C. Edwards, Esq.; Edwards Neils LLC

(57) ABSTRACT

A suspension board with circuit includes a metal supporting layer and an insulating layer formed on the metal supporting layer. The insulating layer is made of a single layer, a concave portion is formed in the insulating layer, an opening portion that exposes the metal supporting layer is formed in the concave portion, and an electrically conductive metal portion is formed in the opening portion.

8 Claims, 8 Drawing Sheets

(56) References Cited

U.S. PATENT DOCUMENTS

| | | | |
|---|---|---|---|
| 2011/0317312 A1* | 12/2011 | Yamaguchi | G11B 5/4826 360/244.2 |
| 2012/0124829 A1 | 5/2012 | Kamei et al. | |
| 2013/0105208 A1* | 5/2013 | Higuchi | G11B 5/486 174/258 |
| 2013/0146349 A1* | 6/2013 | Lee | H05K 1/115 174/262 |

* cited by examiner

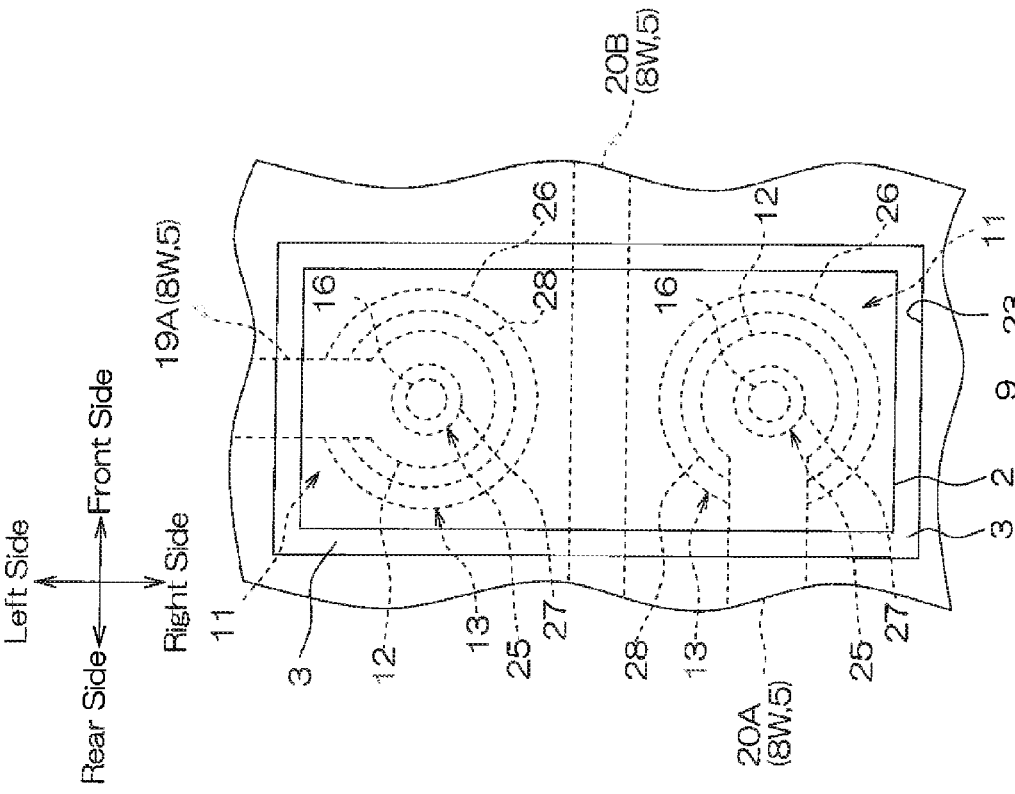
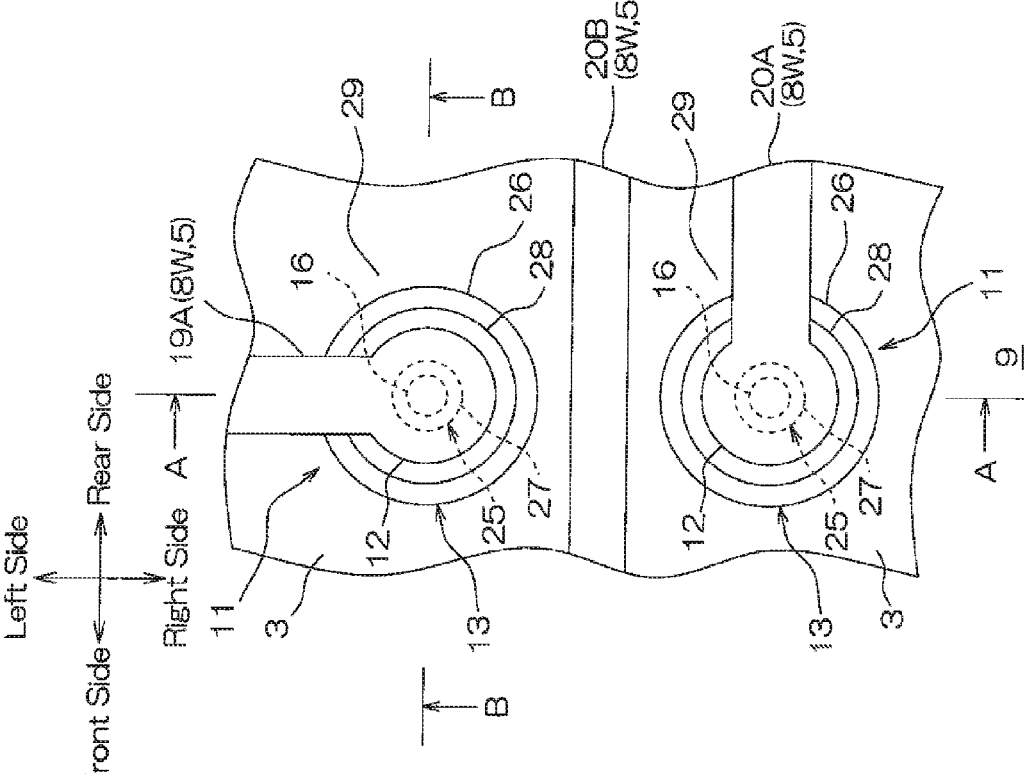

FIG. 4A
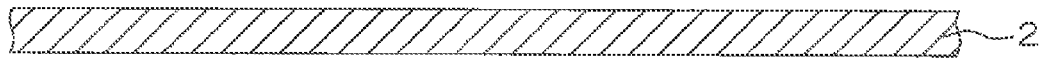
FIG. 4B
FIG. 4C
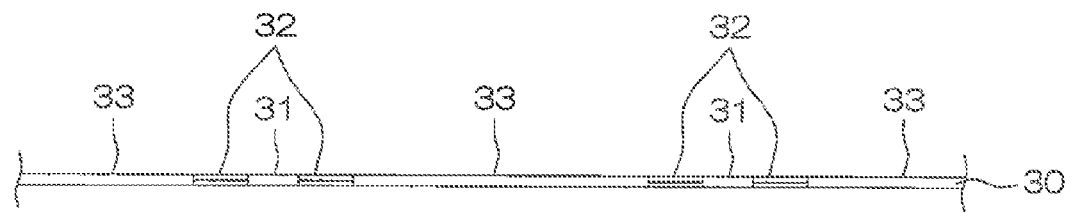
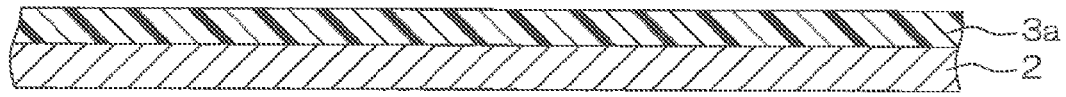
FIG. 4D
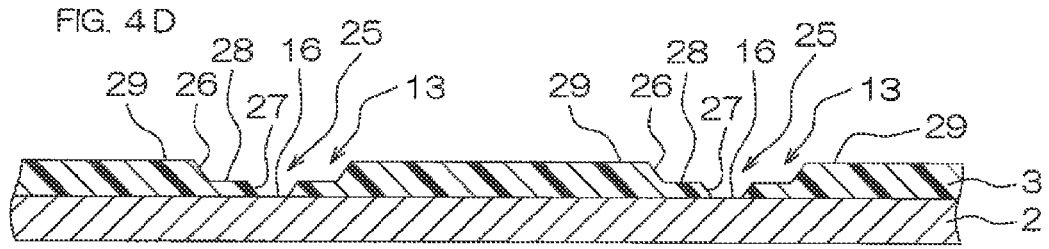

SUSPENSION BOARD WITH CIRCUIT AND PRODUCING METHOD THEREOF

CROSS-REFERENCE TO RELATED APPLICATION

The present application claims priority from Japanese Patent Application No. 2013-269912 filed on Dec. 26, 2013, the contents of which are hereby incorporated by reference into this application.

BACKGROUND OF THE INVENTION

Field of the Invention

The present invention relates to a suspension board with circuit and a producing method thereof, to be specific, to a suspension board with circuit used in a hard disk drive and a producing method thereof.

Description of Related Art

A suspension board with circuit including a metal supporting board, a base insulating layer that is formed thereon, and a conductive pattern that is formed thereon such as a wire or the like has been known. The suspension board with circuit is mounted with a magnetic head and is used in a hard disk drive or the like.

The conductive pattern includes a write wire and a read wire. The front end portion of each of the wires is connected to a magnetic head and the rear end portion of each of the wires is connected to an external board. In order to reduce noise in signal transmission, the conductive pattern includes one pair of write wires and one pair of read wires and in each of the write wires and each of the read wires, a differential signal wire has been generally used in which a first wire through which a first electrical signal is transmitted and a second wire through which a second electrical signal that is antiphase with respect to the first electrical signal is transmitted are included.

In the differential signal wire, differential impedance occurs, so that the differential impedance is required to be reduced.

Thus, a structure (interleaved wiring) has been known in which the first wire and the second wire in the one pair of the write wires and the first wire and the second wire in the one pair of the read wires are alternately disposed. In the structure, it is required that the first wire crosses the second wire without contact with each other. That is, it is required that one wire (the first wire) strides over the other wire (the second wire) to be electrically connected thereto.

As such a method, for example, in Japanese Unexamined Patent Publication No. 2012-414217, a suspension board has been disclosed in which electrically conductive metal portions, each of which penetrates through a base insulating layer and connects a first wire to a metal supporting board, are formed at one side of a second wire and at the opposite side thereto with the second wire to be strode over. In the suspension board, the first wire at one side is electrically connected to the first wire at the other side via the electrically conductive metal portion at one side, the metal supporting board, and the electrically conductive metal portion at the other side, so that the first wire is capable of crossing the second wire without contact therewith.

The electrically conductive metal portion is formed into a circular shape in plane view having a diameter that is longer than the length in a widthwise direction of the wire in order to surely connect the first wire to the metal supporting board.

On the other hand, other than in the interleaved wiring, in ground wiring in which the base insulating layer is penetrated through to be grounded to the metal supporting board, the electrically conductive metal portion is also used as an electrically conductive portion that electrically conducts a ground wire to the metal supporting board.

SUMMARY OF THE INVENTION

In the suspension board, a larger number of terminal portions that connect the suspension board to the exterior and wires along with the terminal portions have been further required. Thus, miniaturization of a conductive pattern that is formed on the suspension board is further more required and the miniaturization, that is, a reduction in diameter of the electrically conductive metal portion is also required.

In the suspension board in Japanese Unexamined Patent Publication No. 2012-114217, pattern formation of the base insulating layer on the metal supporting board is performed so that an opening portion in a circular shape in plane view from which the metal supporting board is exposed is formed and next, the electrically conductive metal portion is formed in the opening portion.

The opening portion is generally formed into a tapered shape in cross-sectional side view in which the diameter gradually expands toward the upper side from an exposed surface of the metal supporting board (a metal exposed surface). When the metal exposed surface is further reduced, there is a disadvantage that the increase ratio of the area of the opening portion around the surface of the base insulating layer with respect to the area of the metal exposed surface is increased, so that the miniaturization of the opening portion around the surface of the base insulating layer and accordingly, the miniaturization of the electrically conductive metal portion are not capable of being achieved.

It is an object of the present invention to provide a suspension board with circuit that is capable of achieving the miniaturization of an electrically conductive metal portion and a method for producing the suspension board with circuit.

A suspension board with circuit of the present invention includes a metal supporting layer and an insulating layer formed on the metal supporting layer, wherein the insulating layer is made of a single layer, a concave portion is formed in the insulating layer, an opening portion that exposes the metal supporting layer is formed in the concave portion, and an electrically conductive metal portion is formed in the opening portion.

According to the suspension board with circuit, the opening portion is formed in the concave portion in the insulating layer, so that a thickness (a distance) between the surface of the concave portion and the metal supporting layer is reduced, compared to a thickness (a distance) between a portion in the surface of the insulating layer other than the concave portion and the metal supporting layer. As a result, an increase in expansion of the tapered state in which the diameter gradually expands from the surface of the metal supporting layer toward the surface of the concave portion is suppressed, so that the opening portion in the surface of the concave portion and furthermore, the electrically conductive metal portion are capable of being miniaturized.

According to the suspension board with circuit of the present invention, the electrically conductive metal portion is miniaturized. As a result, the number of terminal portions and wires per unit area that are formed in the suspension board with circuit is capable of being increased and the degree of freedom in placement of the terminal portions and the wires is capable of being increased.

A suspension board with circuit of the present invention is obtained by forming an insulating layer on a metal supporting layer so as to form a concave portion and an opening portion allowing the metal supporting layer to expose from the concave portion by gradation exposure to light and next, by forming an electrically conductive metal portion in the opening portion.

According to the suspension board with circuit, the opening portion is formed in the concave portion in the insulating layer, so that the thickness between the surface of the concave portion and the metal supporting layer is reduced, compared to the thickness between a portion in the surface of the insulating layer other than the concave portion and the metal supporting layer. As a result, an increase in expansion of the tapered state in which the diameter gradually expands from the surface of the metal supporting layer toward the surface of the concave portion is suppressed, so that the opening portion in the surface of the concave portion and furthermore, the electrically conductive metal portion are capable of being miniaturized.

A method for producing a suspension board with circuit of the present invention includes the steps of preparing a metal supporting layer, forming an insulating layer on the metal supporting layer so as to form a concave portion and an opening portion allowing the metal supporting layer to expose from the concave portion by gradation exposure to light, and forming an electrically conductive metal portion in the opening portion.

According to the method for producing a suspension board with circuit, the opening portion is formed in the concave portion in the insulating layer, so that the thickness between the surface of the concave portion and the metal supporting layer is capable of being reduced, compared to the thickness between a portion in the surface of the insulating layer other than the concave portion and the metal supporting layer. As a result, an increase in expansion of the tapered state in which the diameter gradually expands from the surface of the metal supporting layer toward the surface of the concave portion is suppressed, so that the opening portion in the surface of the concave portion and furthermore, the electrically conductive metal portion are capable of being miniaturized.

According to the method for producing a suspension board with circuit of the present invention, the electrically conductive metal portion is capable of being miniaturized. As a result, the number of terminal portions and wires per unit area that are formed in the suspension board with circuit is capable of being increased and the degree of freedom in placement of the terminal portions and the wires is capable of being increased.

In the method for producing a suspension board with circuit of the present invention, it is preferable that the gradation exposure to light is performed using one piece of mask.

According to the method for producing a suspension board with circuit, patterns of the concave portion and the opening portion in the insulating layer are capable of being formed in one step, so that the suspension board with circuit is capable of being easily produced. When the gradation exposure to light is performed with one piece of mask, the improvement in accuracy of the relative arrangement of the concave portion and the opening portion is capable of being achieved.

BRIEF DESCRIPTION OF THE DRAWINGS

FIG. 2A shows an enlarged view of a cross-connecting portion of the suspension board with circuit shown in FIG. 1 and shows a plan view and FIG. 2B shows an enlarged view of a cross-connecting portion of the suspension board with circuit shown in FIG. 1 and shows a bottom view.

FIG. 4A shows a process drawing for illustrating a method for producing the suspension board with circuit shown in FIG. 1 and shows a sectional view along an A-A line in FIG. 2A, illustrating a step of preparing a metal supporting layer, FIG. 4B shows a process drawing for illustrating a method for producing the suspension board with circuit shown in FIG. 1 and shows a sectional view along an A-A line in FIG. 2A, illustrating a step of forming a base film, FIG. 4C shows a process drawing for illustrating a method for producing the suspension board with circuit shown in FIG. 1 and shows a sectional view along an A-A line in FIG. 2A, illustrating a step of exposing the base film to light, and FIG. 4D shows a process drawing for illustrating a method for producing the suspension board with circuit shown in FIG. 1 and shows a sectional view along an A-A line in FIG. 2A, illustrating a step of developing the base film.

DETAILED DESCRIPTION OF THE INVENTION

Figure 1:
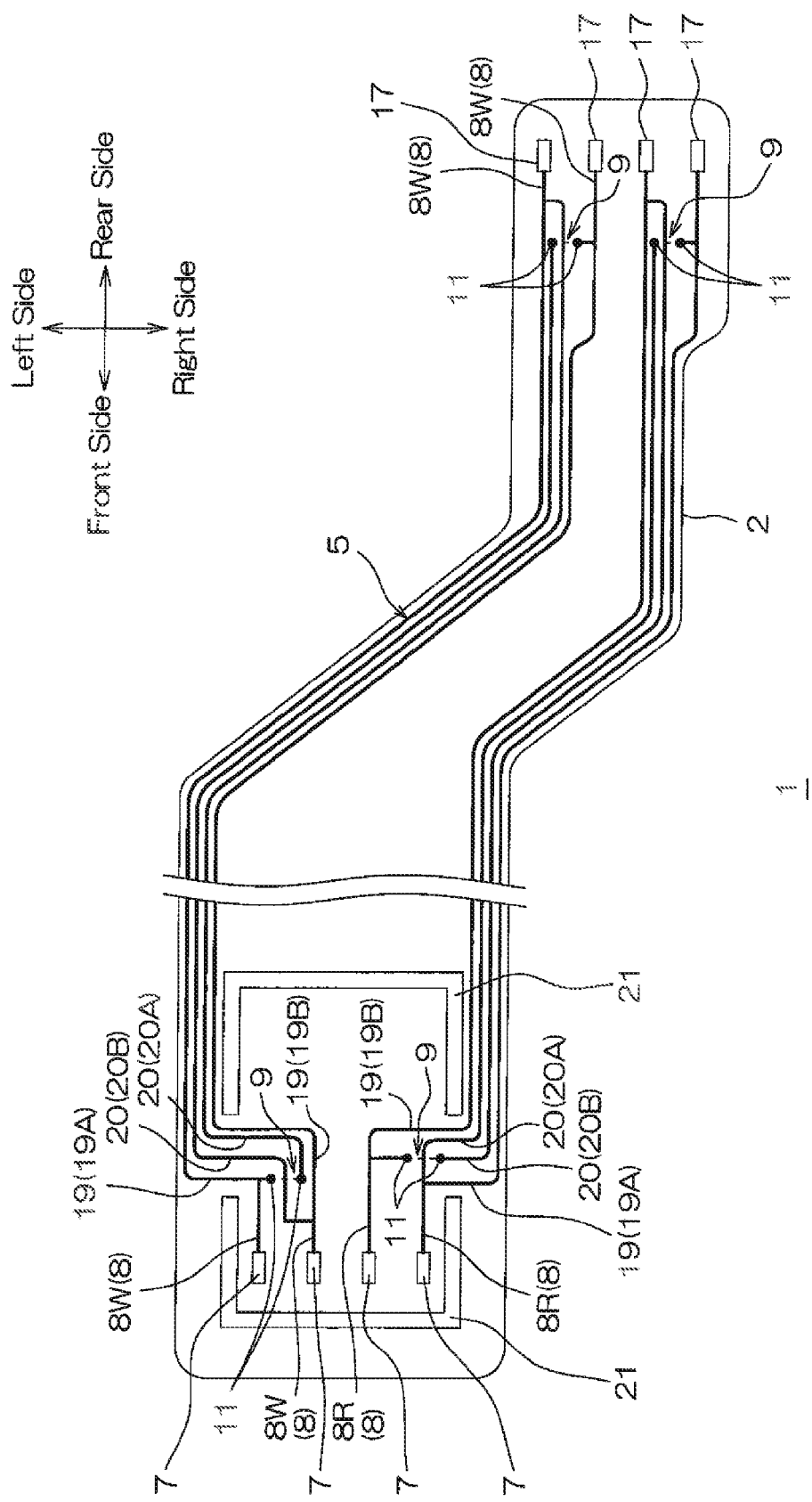
FIG. 1 shows a plan view of one embodiment of a suspension board with circuit of the present invention.
Figure 3:
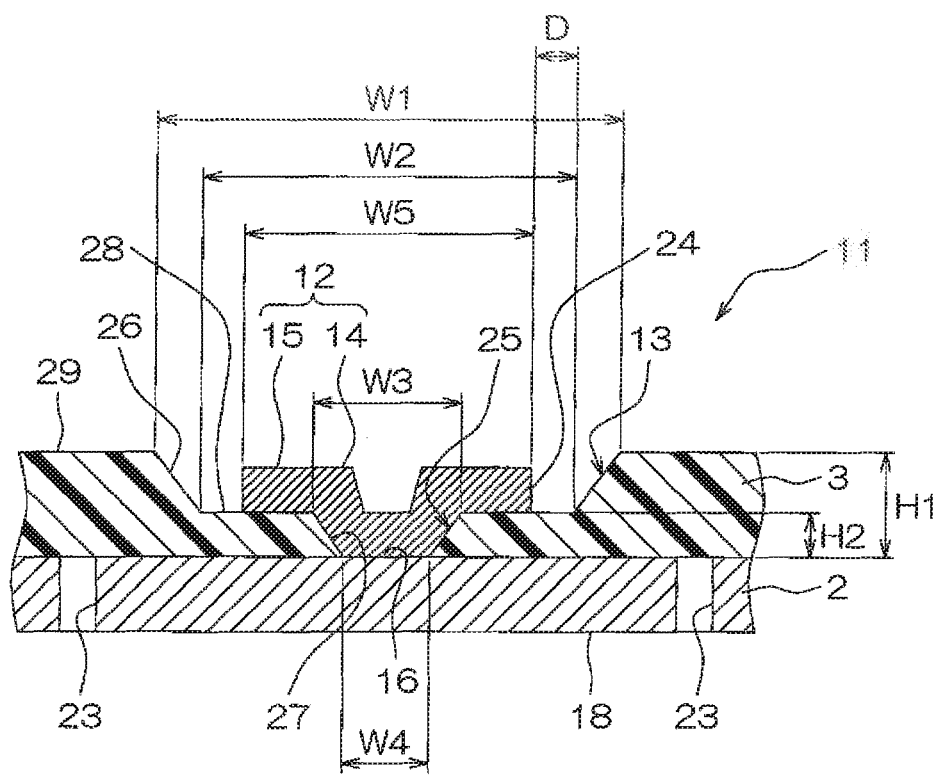
FIG. 3 shows an enlarged view of a signal wire-connecting portion of the suspension board with circuit shown in FIG. 1 and shows a sectional view along a B-B line in FIG. 2A.

In FIG. 1, the left side of the paper surface is referred to as a front side (one side in a first direction); the right side of the paper surface is referred to as a rear side (the other side in the first direction); the upper side of the paper surface is referred to as a left side (one side in a second direction); the lower side of the paper surface is referred to as a right side (the other side in the second direction); the near side of the paper surface is referred to as an upper side (one side in a third direction, one side in a thickness direction); and the far side of the paper surface is referred to as a lower side (the other side in the third direction, the other side in the thickness direction). Directions in figures other than FIG. 1 are also in conformity with the above-described directions in FIG. 1. In FIGS. 1 to 3, a cover insulating layer 6 is omitted so as to clearly show the arrangement of a conductive pattern 5 and a signal wire-connecting portion 11.

As shown in FIG. 1, a suspension board with circuit 1 is formed into a flat belt shape extending in a longitudinal direction. As shown in FIG. 5G, the suspension board with circuit 1 includes a metal supporting layer 2; as an insulating layer, a base insulating layer 3 that is formed on the metal supporting layer 2; the conductive pattern 5 that is formed on the base insulating layer 3; and the cover insulating layer 6 that is formed on the base insulating layer 3 so as to cover the conductive pattern 5.

The metal supporting layer 2 is formed into a shape that corresponds to a shape in plane view of the suspension board with circuit 1. In the metal supporting layer 2, a slit 21 that sandwiches head-side terminals 7 to be described later in a right-left direction therebetween and a support opening portion 23 to be described later are formed so as to penetrate in the thickness direction.

Examples of a metal material that forms the metal supporting layer 2 include stainless steel, 42 alloy, aluminum, copper-beryllium, and phosphor bronze. Preferably, stainless steel is used.

The metal supporting layer 2 has a thickness of, for example, 5 µm or more, or preferably 10 µm or more, and of, for example, 60 µm or less, or preferably 30 µm or less.

On the upper surface of the metal supporting layer 2, the base insulating layer 3 is formed into patterns that correspond to the conductive pattern 5 and the signal wire-connecting portion 11 (described later). A concave portion 13 to be described later is formed in the base insulating layer 3 in the signal wire-connecting portion 11.

An example of an insulating material that forms the base insulating layer 3 includes a synthetic resin such as a polyimide resin, a polyamide-imide resin, an acrylic resin, a polyether nitrile resin, a polyethersulfone resin, a polyethylene terephthalate resin, a polyethylene naphthalate resin, and a polyvinyl chloride resin. Preferably, a polyimide resin is used.

The base insulating layer 3 (excluding the signal wire-connecting portion 11) has a thickness of, for example, 1 µm or more, or preferably 3 µm or more, and of, for example, 35 µm or less, or preferably 20 µm or less.

The conductive pattern 5 includes the head-side terminals 7 that are disposed in the front end portion of the suspension board with circuit 1, external-side terminals 17 that are disposed in the rear end portion of the suspension board with circuit 1, and signal wires 8 that are connected to the head-side terminals 7 and the external-side terminals 17.

At the front end portion of the suspension board with circuit 1, a plurality (four pieces) of the head-side terminals 7 are disposed at spaced intervals to each other in the right-left direction. Each of the head-side terminals 7 is formed into a generally rectangular shape in plane view that is long in a front-rear direction.

At the rear end portion of the suspension board with circuit 1, a plurality (four pieces) of the external-side terminals 17 are disposed at spaced intervals to each other in the right-left direction. Each of the external-side terminals 17 is formed into a generally rectangular shape in plane view that is long in the front-rear direction.

The signal wires 8 include one pair of write wires 8W and one pair of read wires 8R.

The one pair of the write wires 8W are disposed in parallel between the head-side terminals 7 and the external-side terminals 17 so as to extend along the left-side end portion of the suspension board with circuit 1.

Each of the write wires 8W includes first wires 19 and second wires 20. That is, the one pair of the write wires 8W include one pair of the first wires 19 and one pair of the second wires 20.

The one pair of the first wires 19 are disposed in parallel at spaced intervals to each other in the right-left direction. Each of the first wires 19 is connected to the corresponding head-side terminal 7 at the front end portion and is connected to the corresponding external-side terminal 17 at the rear end portion.

The one pair of the second wires 20 are disposed at the inner side in the right-left direction of the one pair of the first wires 19 and are disposed in parallel at spaced intervals to each other in the right-left direction.

To be specific, a second wire 20A that corresponds to a first wire 19A of the write wire 8W at the outer side in the right-left direction is disposed in adjacent to a first wire 19B of the write wire 8W at the inner side in the right-left direction. A second wire 20B that corresponds to the first wire 19B of the write wire 8W at the inner side in the right-left direction is disposed in adjacent to the first wire 19A of the write wire 8W at the outer side in the right-left direction.

In this way, in the right-left direction, the first wire 19B of the write wire 8W at the inner side (one side) in the right-left direction, the second wire 20A that corresponds to the first wire 19A of the write wire 8W at the outer side (the other side) in the right-left direction, the second wire 20B that corresponds to the first wire 19B of the write wire 8W at the inner side (one side) in the right-left direction, and the first wire 19A of the write wire 8W at the outer side (the other side) in the right-left direction are disposed in parallel. That is, in the right-left direction, the first wire 19B of the write wire 8W at one side, the second wire 20A of the write wire 8W at the other side, the second wire 20B of the write wire 8W at one side, and the first wire 19A of the write wire 8W at the other side are alternately disposed. In other words, two pieces of wires of the write wires 8W at one side and two pieces of wires of the write wires 8W at the other side are alternately disposed.

Each of the second wires 20 branches off from one side of the front-side portion or the rear-side portion of the first wire 19 and is connected to (joins) the corresponding first wire 19 via a cross-connecting portion 9 that is positioned at the other side thereof to be described later.

To be specific, in the write wire 8W at the outer side in the right-left direction, the second wire 20 branches off from the rear-side portion of the first wire 19 and is connected at the front-side portion thereof via the cross-connecting portion 9. In the write wire 8W at the inner side in the right-left direction, the second wire 20 branches off from the front-side portion of the first wire 19 and is connected at the rear-side portion thereof via the cross-connecting portion 9.

The one pair of the read wires 8R are disposed in parallel between the head-side terminals 7 and the external-side terminals 17 so as to extend along the right-side end portion of the suspension board with circuit 1. The one pair of the read wires 8R have generally the same structure (generally bilaterally symmetrical) as that of the one pair of the write wires 8W and the description thereof is omitted.

Examples of a conductive material that forms the conductive pattern 5 (and an electrically conductive metal portion 12 to be described later) include copper, nickel, gold, and solder or alloys thereof. Preferably, copper is used. The conductive pattern 5 has a thickness of, for example, 3 μm or more, or preferably 5 μm or more, and of, for example, 50 μm or less, or preferably 20 μm or less.

Each of the head-side terminals 7 and each of the external-side terminals 17 have a width of, for example, 10 μm or more, or preferably 20 μm or more, and of, for example, 1000 μm or less, or preferably 800 μm or less.

Each of the signal wires 8 has a width of, for example, 5 μm or more, or preferably 8 μm or more, and of, for example, 200 μm or less, or preferably 100 μm or less.

As shown in FIG. 5G, the cover insulating layer 6 is formed on the upper surface of the base insulating layer 3 that is exposed from the conductive pattern 5 and the upper surfaces and the side surfaces of the signal wires 8 (and the electrically conductive metal portions 12 to be described later). The cover insulating layer 6 is formed so as to expose the head-side terminals 7 and the external-side terminals 17.

An example of an insulating material that forms the cover insulating layer 6 includes the same insulating material as that which forms the base insulating layer 3. The cover insulating layer 6 has a thickness of, for example, 2 μm or more, or preferably 4 μm or more, and of, for example, 20 μm or less, or preferably 15 μm or less.

Next, the cross-connecting portion 9 is described in detail.

As shown in FIG. 1, the cross-connecting portions 9 are provided so as to correspond to the front end portion of the second wire 20A of the write wire 8W, the rear end portion of the second wire 20B of the write wire 8W, the rear end portion of the second wire 20A of the read wire 8R, and the front end portion of the second wire 20B of the read wire 8R. Each of the cross-connecting portions 9 has generally the same structure and thus, in the following, the cross-connecting portion 9 that corresponds to the front end portion of the second wire 20A of the write wire 8W is described in detail.

As shown in FIG. 5G, the cross-connecting portion 9 includes two pieces of the signal wire-connecting portions 11 and a support-connecting portion 18 that is disposed therebetween and electrically connects the two pieces of the signal wire-connecting portions 11.

As shown in FIG. 3, each of the signal wire-connecting portions 11 includes the concave portion 13 that is formed in the base insulating layer 3 and an opening portion 25 that is formed in the concave portion 13.

The concave portion 13 is formed into a generally circular shape in plane view and is formed into a tapered shape in cross-sectional side view (a generally truncated cone shape) in which the diameter gradually expands toward the upper side (that is, a cross-sectional area of the opening is gradually increased toward the upper side). The concave portion 13 is defined and formed by an inclined surface (a first circumference side surface) of a first circumference side portion 26 of the base insulating layer 3 that forms the circumference side portion of the concave portion and is formed so that the surface thereof inclines with respect to the thickness direction and by the upper surface (the bottom surface of the concave portion) of a thin film portion 28 of the base insulating layer 3 that forms the bottom portion of the concave portion 13 and is formed so that the upper surface thereof is flat.

A thick film portion 29 of the base insulating layer 3 that is continuous to the first circumference side portion 26 is formed at the outer circumference of the concave portion 13. The upper surface of the thick film portion 29 is formed into a flat shape. The thick film portion 29 and the thin film portion 28 form a first step portion. In plane view, a diameter $W_1$ of the outer-side circumference end edge of the first circumference side portion 26 forms the outer diameter of the concave portion 13 and a diameter $W_2$ of the inner-side circumference end edge of the first circumference side portion 26 forms the inner diameter of the concave portion 13 (ref: FIG. 3).

The opening portion 25 is formed at generally the center in plane view of the thin film portion 28 (the bottom surface of the concave portion).

The opening portion 25 is formed into a generally circular shape in plane view and is formed into a tapered shape in cross-sectional side view (a generally truncated cone shape) in which the diameter gradually expands toward the upper side. The opening portion 25 is defined and formed by an inclined surface (a second circumference side surface) of a second circumference side portion 27 that forms the circumference side portion of the opening portion 25 and is formed so that the surface thereof inclines with respect to the thickness direction and by the surface (a metal exposed surface 16) of the metal supporting layer 2 that forms the bottom portion of the opening portion 25 and is exposed from the base insulating layer 3. The thin film portion 28 and the metal exposed surface 16 form a second step portion. In plane view, a diameter of the outer-side circumference end edge of the second circumference side portion 27 forms an outer diameter $W_3$ of the opening portion 25. On the other hand, the inner-side circumference end edge of the second circumference side portion 27 coincides with the outer edge of the metal exposed surface 16 and the diameter thereof forms an inner diameter $W_4$ of the opening portion 25. The opening portion 25 is formed so as to be concentric with the concave portion 13.

The base insulating layer 3 is formed of a single layer. That is, the thick film portion 29, the first circumference side portion 26, the thin film portion 28, and the second circumference side portion 27 are integrally formed. The upper surface of the thick film portion 29, the inclined surface (the first circumference side surface) of the first circumference side portion 26, the upper surface of the thin film portion 28 (the bottom surface of the concave portion), and the inclined surface (the second circumference side surface) of the second circumference side portion 27 and the boundaries thereof are formed so as to be a continuous surface without a joint.

The signal wire-connecting portion 11 includes the electrically conductive metal portion 12. The electrically conductive metal portion 12 fills the opening portion 25.

The electrically conductive metal portion 12 is formed into a generally circular shape in plane view and is formed so as to be concentric with the opening portion 25 and the concave portion 13. The electrically conductive metal portion 12 is in contact with and covers the entire surfaces of the metal exposed surface 16 and the second circumference side surface (the inclined surface of the second circumference side portion 27) and a part of the inner side of the bottom surface of the concave portion (the upper surface of the thin film portion 28).

The electrically conductive metal portion 12 integrally includes an inner-side portion 14 and an outer-side portion 15 that expands outwardly from the circumference end edge of the inner-side portion 14.

The inner-side portion 14 is formed into a generally circular shape in plane view and the surface thereof is, in cross-sectional side view, formed into a U-shape along the metal exposed surface 16 and the second circumference side surface. The inner-side portion 14 covers the metal exposed surface 16 and the second circumference side surface. The outer circumference edge of the inner-side portion 14 coincides with the outer-side circumference end edge of the second circumference side portion 27 and the diameter thereof coincides with the outer diameter $W_3$ of the opening portion 25.

The outer-side portion 15 is formed into a generally annulus ring shape in plane view. A circumference end edge 24 of the outer-side portion 15 is disposed in opposed relation to the first circumference side portion 26 at spaced intervals thereto. The upper surface of the outer-side portion 15 is disposed at the lower side with respect to the upper surface of the thick film portion 29.

The concave portion 13 has an outer diameter $W_1$ (the diameter of the outer-side circumference end edge of the concave portion 13) of, for example, 33 μm or more, or preferably 38 μm or more, and of, for example, 1000 μm or less, or preferably 500 μm or less.

The concave portion 13 has an inner diameter $W_2$ (the diameter of the inner-side circumference end edge of the concave portion 13) of, for example, 29 μm or more, or preferably 34 μm or more, and of, for example, 996 μm or less, or preferably 496 μm or less.

The opening portion 25 has an outer diameter $W_3$ (the diameter of the outer-side circumference end edge of the opening portion 25, that is, the diameter of the inner-side portion 14 of the electrically conductive metal portion 12) of, for example, 9 μm or more, or preferably 14 μm or more, and of, for example, 250 μm or less, or preferably 150 μm or less. The outer diameter $W_3$ of the opening portion 25 with respect to the inner diameter $W_2$ of the concave portion 13 is, for example, 0.1% or more, or preferably 1% or more, and is, for example, 90% or less, or preferably 80% or less.

The opening portion 25 has an inner diameter $W_4$ (the diameter of the inner-side circumference end edge of the opening portion 25) of, for example, 5 μm or more, or preferably 10 μm or more, and of, for example, 200 μm or less, or preferably 100 μm or less. The inner diameter $W_4$ of the opening portion 25 with respect to the outer diameter $W_3$ of the opening portion 25 is, for example, 10% or more, or preferably 20% or more, and is, for example, 90% or less, or preferably 80% or less.

The outer-side portion 15 of the electrically conductive metal portion 12 has a diameter $W_5$ of, for example, 10 μm or more, or preferably 15 μm or more, and of, for example, 900 μm or less, or preferably 490 μm or less.

The thick film portion 29 (the base insulating layer 3) has a thickness $H_1$ of, for example, 1 μm or more, or preferably 4 μm or more, and of, for example, 30 μm or less, or preferably 20 μm or less.

The thin film portion 28 has a thickness $H_2$ of, for example, 0.1 μm or more, or preferably 1 μm or more, and of, for example, 20 μm or less, or preferably 10 μm or less. The thickness $H_2$ of the thin film portion 28 with respect to the thickness $H_1$ of the thick film portion 29 is, for example, 10% or more, or preferably 20% or more, and is, for example, 90% or less, or preferably 80% or less.

A distance D between the circumference end edge 24 of the outer-side portion 15 and the inner-side circumference end edge of the first circumference side portion 26 is, for example, 1 μm or more, or preferably 5 μm or more, and is, for example, 490 μm or less, or preferably 240 μm or less.

As shown in FIGS. 2 and 5G, the two pieces of the signal wire-connecting portions 11 are disposed at spaced intervals to each other in the right-left direction by sandwiching the second wire 20B therebetween. The signal wire-connecting portion 11 at one side (the left side) is connected to the wire that branches off from the front end potion of the first wire 19A and the signal wire-connecting portion 11 at the other side (the right side) is connected to the front end portion of the second wire 20A. The two pieces of the signal wire-connecting portions 11 are electrically connected to each other by the support-connecting portion 18.

The support-connecting portion 18 is formed as a portion of the metal supporting layer 2 that is defined by the support opening portion 23.

As shown in FIGS. 2B and 3, the support opening portion 23 penetrates in the thickness direction of the metal supporting layer 2, is formed into a generally rectangular frame shape in bottom view that is long in the right-left direction, and is formed so as to surround the two pieces of the signal wire-connecting portions 11.

The support-connecting portion 18 is, at the inside of the support opening portion 23, formed into a generally rectangular shape in bottom view that is long in the right-left direction and is disposed so as to cross the second wire 20B of the write wire 8W at one side in the right-left direction. The support-connecting portion 18 is disposed at spaced intervals to the inner side of the metal supporting layer 2 around the support opening portion 23. Thus, the support-connecting portion 18 is electrically insulated from the metal supporting layer 2 around the support opening portion 23.

Each of the electrically conductive metal portions 12 of the two pieces of the signal wire-connecting portions 11 is connected to the common support-connecting portion 18. That is, when projected in the thickness direction, the support-connecting portion 18 includes the two pieces of the signal wire-connecting portions 11 and the second wire 20B of the write wire 8W that is sandwiched therebetween.

In this way, the two pieces of the signal wire-connecting portions 11 are electrically connected to each other via the support-connecting portion 18, while striding over the second wire 20B of the write wire 8W. That is, the first wire 19A is electrically connected (electrically conducted) to the second wire 20A via the electrically conductive metal portion 12 at one side, the support-connecting portion 18, and the signal wire-connecting portion 11 at the other side.

The suspension board with circuit 1 is mounted with a magnetic head (not shown) and an external board (not shown) and then, is mounted on a hard disk drive.

Next, the method for producing the suspension board with circuit 1 is described with reference to FIGS. 4 and 5.

First, as shown in FIG. 4A, in this method, the metal supporting layer 2 in a flat plate shape extending in the longitudinal direction is prepared.

Next, as shown in FIG. 4B, a base film 3a having photosensitivity is formed on the metal supporting layer 2.

In order to form the base film 3a, for example, a solution (a varnish) of a synthetic resin having photosensitivity is applied onto the metal supporting layer 2 and the resulting layer is dried.

Next, as shown in FIG. 4C, the base film 3a is exposed to light via one piece of gradation photomask 30 as a mask.

The gradation photomask 30 includes mask patterns, each of which is made of a light shielding portion 31, light semi-transmitting portions 32, and a light completely-transmitting portion 33.

The gradation photomask 30 is disposed at the upper side of the base film 3a.

To be specific, the light completely-transmitting portion 33 is opposed to a portion in which the thick film portion 29 is formed, the light semi-transmitting portions 32 are opposed to a portion in which the thin film portion 28 is formed, and the light shielding portion 31 is opposed to a portion in which the metal exposed surface 16 is formed.

Thereafter, the base film 3a is subjected to gradation exposure to light from the upper side via the gradation photomask 30.

Next, as shown in FIG. 4D, the base film 3a is developed.

In this way, the portion that is opposed to the light shielding portion 31, that is, an unexposed portion is dissolved and the portion that is opposed to the light semi-transmitting portion 32, that is, a semi-exposed portion in which the degree of light exposure is adjusted is partially dissolved, both of which are developed, and thereafter, are cured by heating as required.

Then, while the thick film portion 29 is formed by corresponding to the light completely-transmitting portion 33 and the thin film portion 28 is formed by corresponding to the light semi-transmitting portion 32, the base insulating layer 3 fails to be formed by corresponding to the light shielding portion 31 and the surface of the metal supporting layer 2 (the metal exposed surface 16) is exposed.

At this time, around the boundaries between the light semi-transmitting portions 32 and the light completely-transmitting portion 33, slight leakage of light exposure from the light completely-transmitting portion 33 is confirmed at the side of the light semi-transmitting portions 32, so that the amount of light exposure of the boundary-side end portions of the light semi-transmitting portions 32 is increased, compared to that of the central portions of the light semi-transmitting portions 32. As a result, after immersion into a developing solution, the first circumference side portion 26 including the inclined surface (the first circumference side surface) is formed on the boundaries between the light semi-transmitting portions 32 and the light completely-transmitting portion 33, that is, between the thin film portion 28 and the thick film portion 29.

Also, around the boundaries between the light shielding portion 31 and the light semi-transmitting portions 32, slight leakage of light exposure from the light semi-transmitting portions 32 is confirmed at the side of the light shielding portion 31, so that the amount of light exposure of the boundary-side end portion of the light shielding portion 31 is increased, compared to that of the central portion of the light shielding portion 31. As a result, after immersion into the developing solution, the second circumference side portion 27 including the inclined surface (the second circumference side surface) is formed on the boundaries between the light shielding portion 31 and the light semi-transmitting portions 32, that is, between the metal exposed surface 16 and the thin film portion 28.

Thus, the base insulating layer 3 is formed into a pattern having the concave portion 13 and the opening portion 25 and includes the thick film portion 29, the first circumference side portion 26, the thin film portion 28, and the second circumference side portion 27.

Figure 5E:
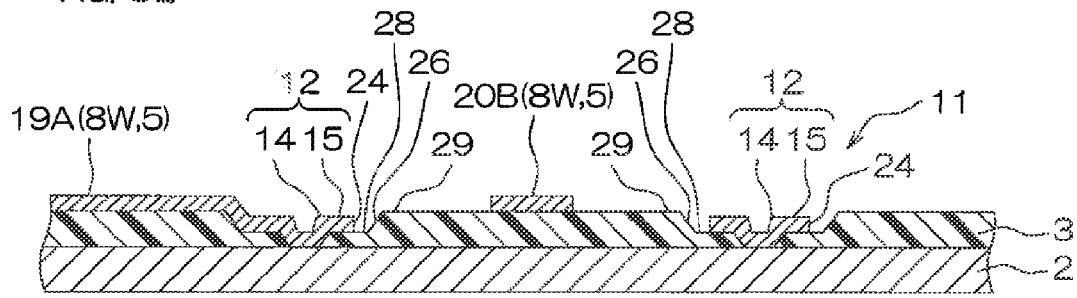
FIG. 5E, subsequent to FIGS. 4A to D, shows a process drawing for illustrating a method for producing the suspension board with circuit shown in FIG. 1 and shows a sectional view along an A-A line in FIG. 2A, illustrating a step of forming a conductive pattern and an electrically conductive metal portion, FIG. 5F, subsequent to FIGS. 4A to D, shows a process drawing for illustrating a method for producing the suspension board with circuit shown in FIG. 1 and shows a sectional view along an A-A line in FIG. 2A, illustrating a step of forming a cover insulating layer, and FIG. 5G, subsequent to FIGS. 4A to D, shows a process drawing for illustrating a method for producing the suspension board with circuit shown in FIG. 1 and shows a sectional view along an A-A line in FIG. 2A, illustrating a step of forming a support opening portion.

Next, as shown in FIG. 5E, the conductive pattern 5 and the electrically conductive metal portion 12 are integrally formed on the base insulating layer 3. That is, the head-side terminals 7, the external-side terminals 17, and the signal wires 8 are formed in the above-described patterns. At the same time, the electrically conductive metal portions 12 are formed in the above-described patterns so as to be continuous to the signal wires 8.

In order to form the conductive pattern 5 and the electrically conductive metal portion 12, for example, a known patterning method such as an additive method is used.

In the additive method, first, a metal thin film (a membrane) that is not shown is formed on the entire upper surfaces of the metal supporting layer 2 and the base insulating layer 3. As the metal thin film, a metal material such as copper, chromium, and nickel and alloys thereof is used. The metal thin film is formed by a thin film forming method such as sputtering and plating. Preferably, the metal thin film is formed by sputtering.

Next, a dry film resist is provided on the surface of the metal thin film to be exposed to light and developed, so that a plating resist that is not shown and has opposite patterns to the patterns of the conductive pattern 5 and the electrically conductive metal portion 12 is formed. Next, the conductive pattern 5 and the electrically conductive metal portion 12 are formed on the surface of the metal thin film that is exposed from the plating resist by electrolytic plating. Next, the plating resist and the metal thin film in the portion in which the plating resist is formed are removed by etching or the like.

Figure 5F:
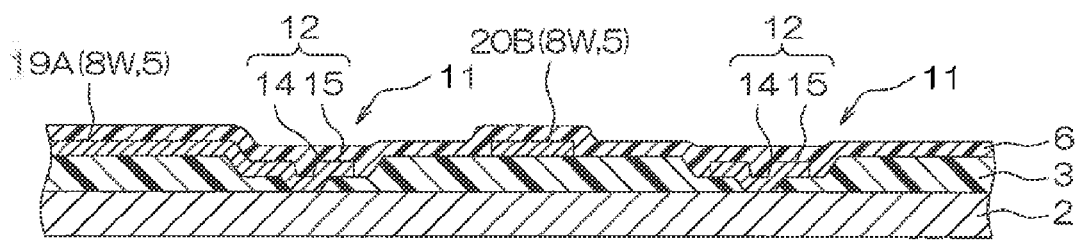
Figure 5G:
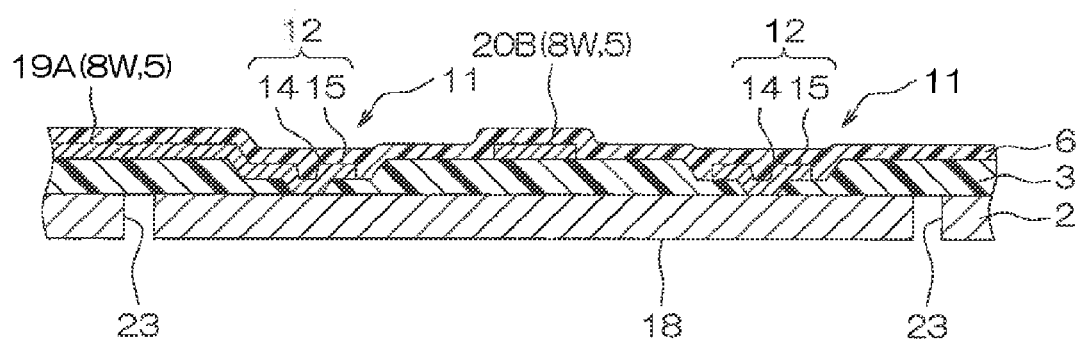

Next, as shown in FIG. 5F, the cover insulating layer 6 is formed.

To be specific, the cover insulating layer 6 is formed on the base insulating layer 3 so as to cover the conductive pattern 5 and the electrically conductive metal portion 12 and to expose the head-side terminals 7 and the external-side terminals 17. For example, a synthetic resin having photosensitivity is applied to the surface of the base insulating layer 3 including the conductive pattern 5 and the electrically conductive metal portion 12 and a cover film having photosensitivity is formed. Thereafter, the cover film is formed into the above-described patterns by being exposed to light and developed and next, is cured by heating as required.

Thereafter, though not shown, a metal plating layer is formed on the upper surfaces of the head-side terminals 7 and the external-side terminals 17 as required. The metal plating layer is, for example, formed of gold and/or nickel and has a thickness of for example, 0.01 to 3 μm.

Next, as shown in FIG. 5G, the support opening portion 23 and the slit 21 (ref. FIG. 1) are formed in the metal supporting layer 2. The support-connecting portion 18 is formed by the formation of the support opening portion 23.

The support opening portion 23 and the slit 21 are formed by, for example, etching, drilling, or laser processing.

In this way, the suspension board with circuit 1 is obtained.

Thereafter, a magnetic head (not shown) is connected to the head-side terminals 7 and an external board (not shown) is connected to the external-side terminals 17.

An electrical signal is, between the magnetic head and the external board, transmitted to the head-side terminals 7, the signal wires 8, and the external-side terminals 17. At this time, the electrical signal that transmits through the second wire 20 at one side is transmitted to the first wire 19 at one side via the signal wire-connecting portion 11 without short-circuiting the second wire 20 at the other side in the cross-connecting portion 9.

In this way, the signal wires 8 (the one pair of the write wires 8W and the one pair of the read wires 8R) are used as differential signal wires. To be specific, in the one pair of the write wires 8W, a first electrical signal is transmitted to the first wires 19A and 19B and a second electrical signal that is antiphase with respect to the first electrical signal is transmitted to the second wires 20A and 20B. Also, to be specific, in the one pair of the read wires 8R, the first electrical signal is transmitted to the first wires 19A and 19B and the second electrical signal that is antiphase with respect to the first electrical signal is transmitted to the second wires 20A and 20B.

In this case, the signal wire-connecting portion 11 is used as a differential signal wire-connecting portion so as to transmit a differential signal.

According to the suspension board with circuit 1 produced in this manner, the concave portion 13 is formed in the signal wire-connecting portion 11, so that the opening portion 25 and furthermore, the electrically conductive metal portion 12 are capable of being miniaturized.

Figure 11:
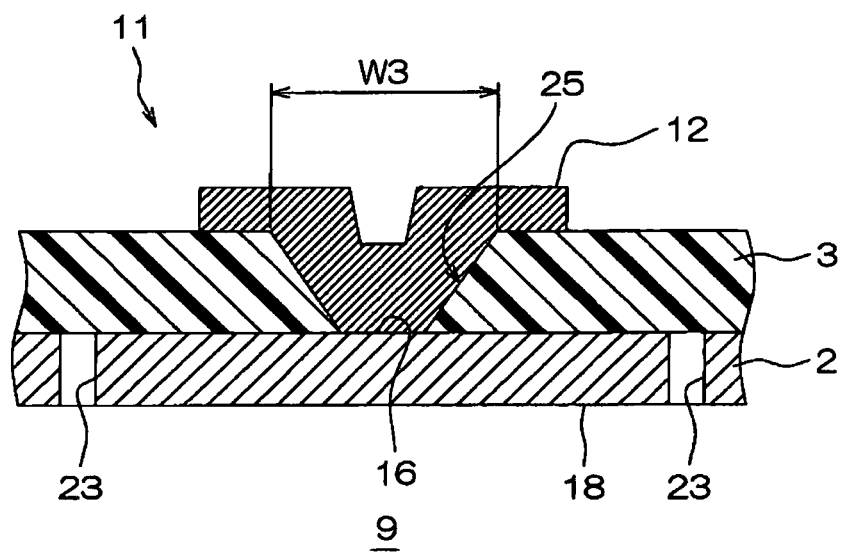
FIG. 11 shows an enlarged view of a signal wire-connecting portion of a conventional suspension board with circuit.

In the conventional suspension board with circuit, as shown in FIG. 11, the electrically conductive metal portion 12 is formed so as to reach the outer-side circumference end edge of the opening portion 25 (that is, the upper surface of the thick film portion 29 in the base insulating layer 3). The opening portion 25 is formed into a tapered shape in which the diameter gradually expands toward the upper side, so that an outer diameter W₃ of the opening portion 25 is increased in accordance with the thickness of the base insulating layer 3.

On the other hand, in the suspension board with circuit 1, the opening portion 25 is formed in the concave portion 13 in the base insulating layer 3 and the electrically conductive metal portion 12 is formed in the opening portion 25, so that the height of the opening portion 25 (that is, the thickness H₂ of the thin film portion 28) is capable of being low. Thus, the expansion of the opening portion 25 (that is, the outer diameter W₃ of the opening portion 25) is capable of being reduced. As a result, miniaturization (that is, a reduction in diameter) of the electrically conductive metal portion 12 (in particular, the inner-side portion 14) that is formed at the inside of the opening portion 25 is capable of being achieved.

Thus, the number of terminal portions and wires per unit area that are formed in the suspension board with circuit 1 is capable of being increased and the degree of freedom in placement of the terminal portions and the wires is capable of being increased.

In the suspension board with circuit 1, the base insulating layer 3 is formed of a single layer and by removing a part of the base insulating layer 3 by light exposure or the like, the concave portion 13 and the opening portion 25 are formed. Thus, the height of the opening portion 25 (the thickness 119 of the thin film portion 28) is capable of being reduced, compared to a case where the concave portion 13 and the opening portion 25 are provided in the base insulating layer 3 by laminating a plurality of the base insulating layers 3, so that a reduction in diameter of the electrically conductive metal portion 12 is capable of being surely achieved. Also, in the suspension board with circuit 1, the surfaces of the concave portion 13 and the opening portion 25 (to be specific, the thick film portion 29, the first circumference side portion 26, the thin film portion 28, and the second circumference side portion 27 and the boundaries thereof) are formed so as to be a continuous surface without a joint. As a result, peeling at the boundary surfaces of a plurality of the base insulating layers 3 is prevented and an excellent strength is provided in the suspension board with circuit 1.

Also, the height of the opening portion 25 (the height between the upper surface of the support-connecting portion 18 and the upper end edge of the opening portion 25) is capable of being reduced, compared to the height of the opening portion in the conventional suspension board with circuit. Thus, when the opening portion 25 is formed by developing, the base film 3a that is a portion corresponding to the opening portion 25 is easily removed and the metal exposed surface 16 is capable of being surely exposed. Furthermore, a residual of the base film that is stored in the opening portion 25 is capable of being further more easily cleansed and removed.

Also, a peripheral portion (the thin film portion 28) that forms the opening portion 25 is formed to be thinner than a peripheral portion that forms an opening portion of the conventional suspension board with circuit. Thus, a shrinkage stress of the base insulating layer 3 that occurs at the time of curing the base insulating layer 3 by heating is reduced and a stress on the electrically conductive metal portion 12 is capable of being reduced. As a result, the connection reliability of the electrically conductive metal portion 12 and the metal exposed surface 16 is capable of being improved.

MODIFIED EXAMPLES

In each figure to be described below, the same reference numerals are provided for members corresponding to each of those described above, and their detailed description is omitted.

In the above-described embodiment in FIG. 3, a distance between the electrically conductive metal portion 12 and the first circumference side portion 26 is relatively short. Alternatively, for example, as shown in FIG. 6, a distance between the electrically conductive metal portion 12 and the first circumference side portion 26 is also capable of being relatively long.

In such a case, a distance D' between the circumference end edge 24 of the outer-side portion 15 and the inner-side circumference end edge of the first circumference side portion 26 is, for example, 490 μm or more, or preferably 600 μm or more, and is, for example, 80000 μm or less, preferably 10000 μm or less, or more preferably 1000 μm or less.

Figure 6:
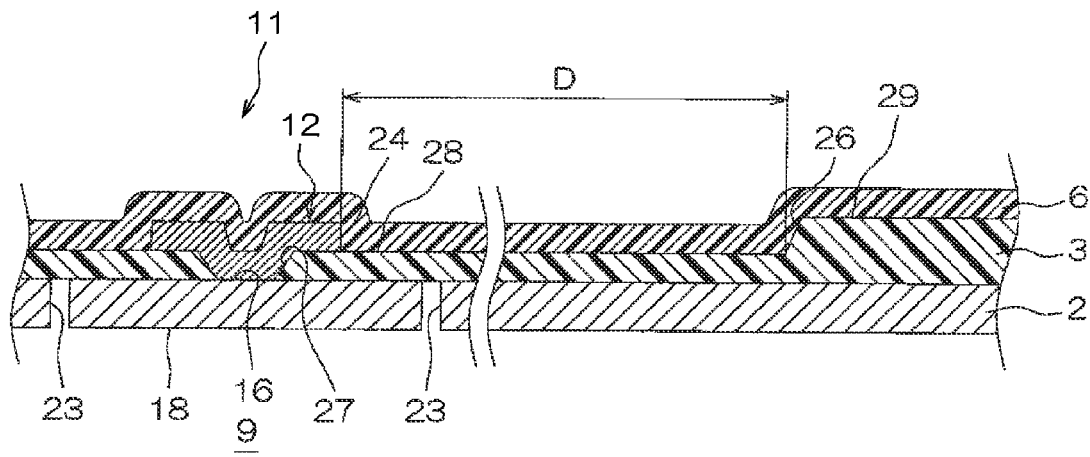
FIG. 6 shows an enlarged view of a signal wire-connecting portion of another embodiment (an embodiment in which a distance between an electrically conductive metal portion and a first circumference side portion is long) of the suspension board with circuit shown in FIG. 1.

The embodiment in FIG. 6 achieves the same function and effect as that of the embodiment in FIG. 3.

In the above-described embodiment in FIG. 3, the electrically conductive metal portion 12 is formed so that the circumference end edge 24 of the outer-side portion 15 is positioned on the thin film portion 28. Alternatively, for example, as shown in FIG. 7, the electrically conductive metal portion 12 is also capable of being formed so that the circumference end edge 24 of the outer-side portion 15 is positioned on the thick film portion 29.

Figure 7:
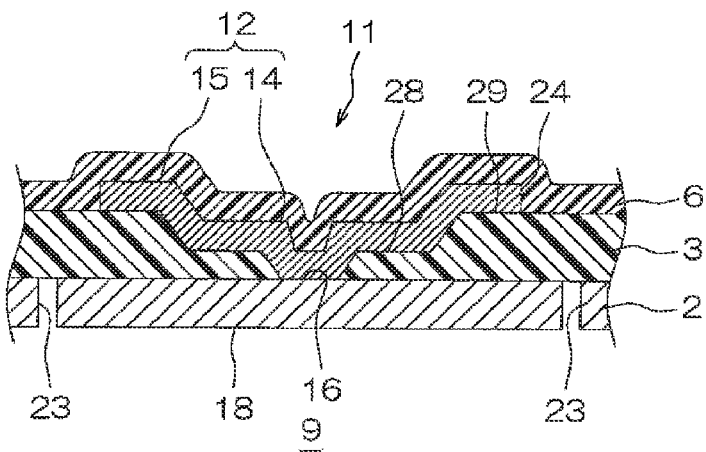
FIG. 7 shows an enlarged view of a signal wire-connecting portion of another embodiment (an embodiment in which a circumference end edge of an electrically conductive metal portion is positioned on a thick film portion) of the suspension board with circuit shown in FIG. 1.

That is, in the embodiment in FIG. 7, the electrically conductive metal portion 12 covers the metal exposed surface 16, the second circumference side portion 27, the thin film portion 28, the first circumference side portion 26, and the thick film portion 29.

In view of capable of surely reducing a diameter of the electrically conductive metal portion 12, as shown in FIG. 3, preferably, the electrically conductive metal portion 12 is formed so that the circumference end edge 24 of the outer-side portion 15 is positioned on the thin film portion 28.

In the embodiment in FIG. 3, the electrically conductive metal portion 12 includes the inner-side portion 14 and the outer-side portion 15. Alternatively, for example, though not shown, the electrically conductive metal portion 12 is also capable of including the inner-side portion 14 only without including the outer-side portion 15.

In the embodiment, the inner-side portion 14 is connected to the second wire 20A.

In view of capable of furthermore miniaturizing the electrically conductive metal portion 12, preferably, the electrically conductive metal portion 12 includes the inner-side portion 14 only.

In view of surely bringing the electrically conductive metal portion 12 into contact with the metal exposed surface 16 and surely achieving electrical conduction between the signal wire-connecting portions 11, preferably, the electrically conductive metal portion 12 includes the inner-side portion 14 and the outer-side portion 15.

In the above-described embodiments in FIGS. 1 to 5, it is illustrated that the support opening portion 23 is formed in the metal supporting layer 2 and the signal wire-connecting portion 11 is used as a differential signal wire-connecting portion. Alternatively, for example, the signal wire-connecting portion 11 is also capable of being used as a ground wire-connecting portion 40 without forming the support opening portion 23 in the metal supporting layer 2.

Figure 8:
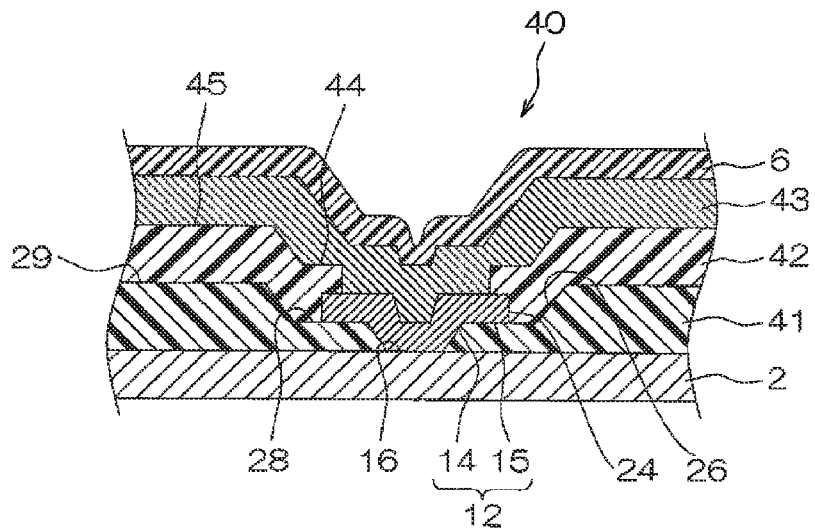
FIG. 8 shows an enlarged view of a signal wire-connecting portion of another embodiment (an embodiment in which a ground wire-connecting portion is provided, a circumference end edge of an electrically conductive metal portion is positioned on a thin film portion, and an upper-side wire is formed on a base upper portion) of the suspension board with circuit shown in FIG. 1.
Figure 9:
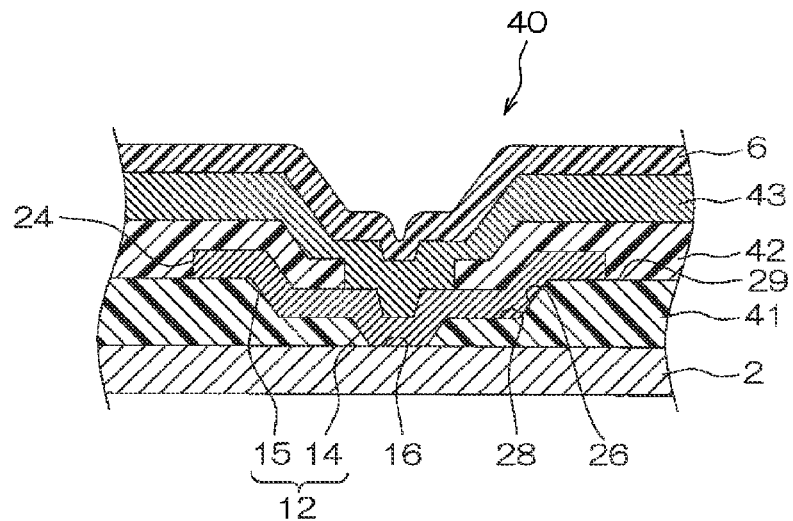
FIG. 9 shows an enlarged view of a signal wire-connecting portion of another embodiment (an embodiment in which a ground wire-connecting portion is provided and a circumference end edge of an electrically conductive metal portion is positioned on a thick film portion) of the suspension board with circuit shown in FIG. 1.
Figure 10:
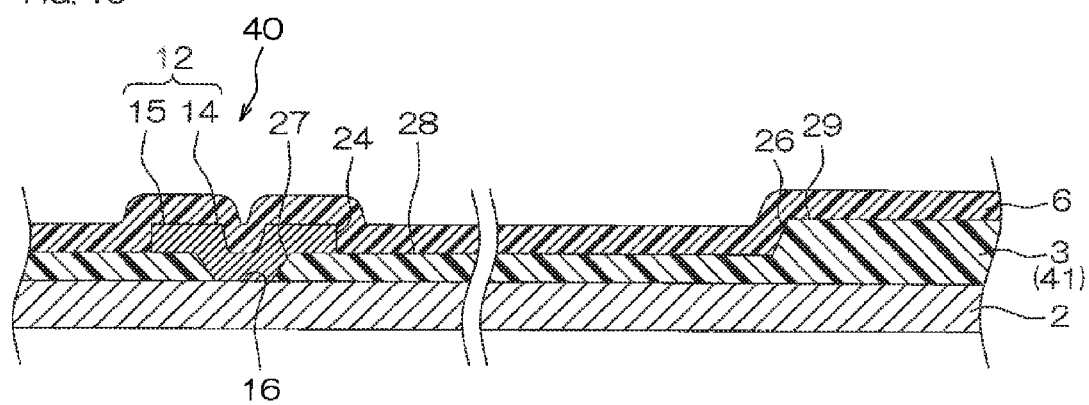
FIG. 10 shows an enlarged view of a signal wire-connecting portion of another embodiment (an embodiment in which a ground wire-connecting portion is provided and a distance between an electrically conductive metal portion and a first circumference side portion is long) of the suspension board with circuit shown in FIG. 1.

As the ground wire-connecting portion 40, the embodiments shown in FIGS. 8 to 10 are used.

The ground wire-connecting portion 40 in FIG. 8 includes the metal supporting layer 2; as the base insulating layer 3, a first base insulating layer 41 that is laminated on the upper side of the metal supporting layer 2; the electrically conductive metal portion 12 that is formed on the metal exposed surface 16 and the first base insulating layer 41; a second base insulating layer 42 that is formed on the first base insulating layer 41; an upper-side wire 43 that is formed on the second base insulating layer 42 and the electrically conductive metal portion 12; and the cover insulating layer 6 that is laminated on the upper-side wire 43.

The metal supporting layer 2 is grounded (ground-connected).

The second base insulating layer 42 is formed into a tapered shape in which the diameter gradually expands toward the upper side and includes a base bottom portion 44 that covers the thin film portion 28 and a base upper portion 45 that covers the first circumference side portion 26 and the thick film portion 29. The base bottom portion 44 covers the circumference end edge 24 of the outer-side portion 15.

The outer-side portion 15 of the electrically conductive metal portion 12 is formed so that the circumference end edge 24 is positioned on the upper surface of the thin film portion 28 and is disposed at spaced intervals to the inner-side circumference end edge of the first circumference side portion 26.

The upper-side wire 43 covers the upper surfaces of the electrically conductive metal portion 12, the base bottom portion 44, and the base upper portion 45. That is, the upper-side wire 43 is electrically connected to the electrically conductive metal portion 12.

In this way, the upper-side wire 43 is ground-connected via the electrically conductive metal portion 12.

In the embodiment in FIG. 8, the electrically conductive metal portion 12 is formed so that the circumference end edge 24 of the outer-side portion 15 is positioned on the thin, film portion 28. Alternatively, for example, as shown in FIG. 9, the electrically conductive metal portion 12 is also capable of being formed so that the circumference end edge 24 of the outer-side portion 15 is positioned on the thick film portion 29.

In the embodiment in FIG. 8, the second base insulating layer 42 is provided and the distance between the electrically conductive metal portion 12 and the first circumference side portion 26 is relatively short. Alternatively, for example, as shown in FIG. 10, the cover insulating layer 6 is directly formed on the first base insulating layer 41 and furthermore, the distance between the electrically conductive metal portion 12 and the first circumference side portion 26 is also capable of being relatively long.

In such a case, the distance D' between the circumference end edge 24 of the outer-side portion 15 and the inner-side circumference end edge of the first circumference side portion 26 is the same distance as that in the embodiment in FIG. 6.

The embodiments in FIGS. 7 to 10 achieve the same function and effect as that of the embodiment in FIG. 8.

In the producing method shown in FIG. 4, the base film 3a is exposed to light via one piece of the gradation photomask 30. Alternatively, for example, though not shown, the base film 3a is also capable of being exposed to light via a plurality (two pieces) of gradation photomasks A and B.

When a plurality of masks are used, one gradation photomask A includes the light shielding portion 31 and the light semi-transmitting portion 32 and the other gradation photomask B includes the light shielding portion 31 and the light completely-transmitting portion 33.

First, by using the one gradation photomask A, the light shielding portion 31 is opposed to a portion in which the thick film portion 29 and the metal exposed surface 16 are formed and the light semi-transmitting portion 32 is opposed to a portion in which the thin film portion 28 is formed to be then exposed to light. Next, by using the other gradation photomask B, the light shielding portion 31 is opposed to a portion in which the metal exposed surface 16 and the thin film portion 28 are formed and the light completely-transmitting portion 33 is opposed to a portion in which the thick film portion 29 is formed to be then exposed to light.

Preferably, by using one piece of the gradation photomask 30, the base film 3a is exposed to light. In this way, patterns of the concave portion 13 and the opening portion 25 in the base insulating layer 3 are capable of being formed in one step, so that the suspension board with circuit 1 is capable of being easily produced. Also, one piece of the gradation photomask 30 is used, so that the improvement in accuracy of the relative arrangement of the concave portion 13 and the opening portion 25 is capable of being achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting layer; and
an insulating layer formed on the metal supporting layer, wherein
the insulating layer is made of a single layer and is formed with a concave portion comprising a circumference side portion and a bottom portion, the bottom portion being formed to have a flat upper surface,
an opening portion that exposes the metal supporting layer is formed in the bottom portion of the concave portion, and
an electrically conductive metal portion is formed in the opening portion, the electrically conductive metal portion being in contact with the exposed metal supporting layer,
wherein the electrically conductive metal portion includes an outer-side portion which covers a part of the flat upper surface of the bottom portion, the outer-side portion having a circumference end edge which is disposed in opposed relation to the circumference side portion at a spaced interval with respect to at least a portion of the circumference side portion.

2. The suspension board with circuit according to claim 1, wherein the concave portion has a tapered shape in a cross-sectional side view, such that the concave portion is inclined inwardly in a thickness direction of the insulating layer from a thick film portion to a thin film portion which is thinner than the thick film portion and which forms the bottom portion of the concave portion.

3. The suspension board with circuit according to claim 1, wherein the concave portion is formed in a generally circular shape in a plane view, such that the tapered shape in the cross-sectional side view is a generally truncated cone shape.

4. The suspension board with circuit according to claim 1, wherein the thick film portion and the thin film portion form a first step portion.

5. The suspension board with circuit according to claim 4, wherein the thin film portion and the exposed metal supporting layer form a second step portion.

6. The suspension board with circuit according to claim 1, wherein an upper surface of the electrically conductive metal portion is disposed below an uppermost surface of the insulating layer.

7. The suspension board with circuit according to claim 1, further comprising a wire which connects to the circumference end edge of the outer-side portion of the electrically conductive metal portion.

8. A suspension board with circuit being obtained by
forming an insulating layer on a metal supporting layer so as to form a concave portion comprising a circumference side portion and a bottom portion and an opening portion allowing the metal supporting layer to expose from the concave portion by gradation exposure to light and next, by
forming an electrically conductive metal portion in the opening portion,
wherein the bottom portion is formed to have a flat upper surface,
wherein the electrically conductive metal portion is in contact with the exposed metal supporting layer, and
wherein the electrically conductive metal portion includes an outer-side portion which covers a part of the flat upper surface of the bottom portion, the outer-side portion having a circumference end edge which is disposed in opposed relation to the circumference side portion at a spaced interval with respect to at least a portion of the circumference side portion.

* * * * *